US005822772A

United States Patent [19]
Chan et al.

[11] Patent Number: 5,822,772
[45] Date of Patent: Oct. 13, 1998

[54] MEMORY CONTROLLER AND METHOD OF MEMORY ACCESS SEQUENCE RECORDERING THAT ELIMINATES PAGE MISS AND ROW MISS PENALTIES

[75] Inventors: Cheng-Sheng Chan, Hsinchu; Tienyo Pan, Taipei, both of Taiwan

[73] Assignee: Industrial Technology Research Institute, Hsinchu, Taiwan

[21] Appl. No.: 620,592

[22] Filed: Mar. 22, 1996

[51] Int. Cl.$^6$ ............................ G06F 13/18; G06F 12/00
[52] U.S. Cl. ............................ 711/158; 711/5; 711/105; 711/150; 711/151; 395/872; 395/877
[58] Field of Search .................................. 395/485, 477, 395/478, 432, 872, 877, 405

[56] References Cited

U.S. PATENT DOCUMENTS

| | | | |
|---|---|---|---|
| 4,843,543 | 6/1989 | Isobe | 395/478 |
| 5,265,236 | 11/1993 | Mehring et al. | 395/413 |
| 5,276,838 | 1/1994 | Rao et al. | 395/444 |
| 5,375,215 | 12/1994 | Hanawa et al. | 395/496 |
| 5,461,718 | 10/1995 | Tatosian et al. | 395/416 |
| 5,611,041 | 3/1997 | Bril et al. | 395/840 |
| 5,617,575 | 4/1997 | Sakakibara et al. | 395/485 |

*Primary Examiner*—Eddie P. Chan
*Assistant Examiner*—Reginald G. Bragdon
*Attorney, Agent, or Firm*—W. Wayne Liauh

[57] ABSTRACT

An improved memory controller is disclosed for accessing a computer memory, which consists of a plurality of banks of page mode memory cells and is connected to a CPU via a split transaction bus with out-of-order completion capability. The improved memory controller comprises: (a) a unified command queue for receiving a memory access command; (b) a plurality of command queues equalling in number to the number of the memory banks; (c) a dispatch logic for dispatching the memory access command into one of the command queues in accordance with which memory bank the access command is to access; (d) a selection logic for selecting one of the command queues as an active command queue to execute a command, wherein all the non-selected command queues are placed on a standby status as standby command queues; and (e) switching logic provided in the selection logic for switching the command execution from the active command queue to a standby command queue, which is made active according to a predetermined criterion, when a page miss is detected or when the active command queue is empty. The switching logic also causes one of the standby command queues to perform a row address selection when the active command queue is accessing said computer memory. With the improved memory controller, penalties associated with row miss and/or page miss are eliminated. As a result, the average memory access latency is minimized and overall memory utilization efficiency is enhanced.

18 Claims, 11 Drawing Sheets

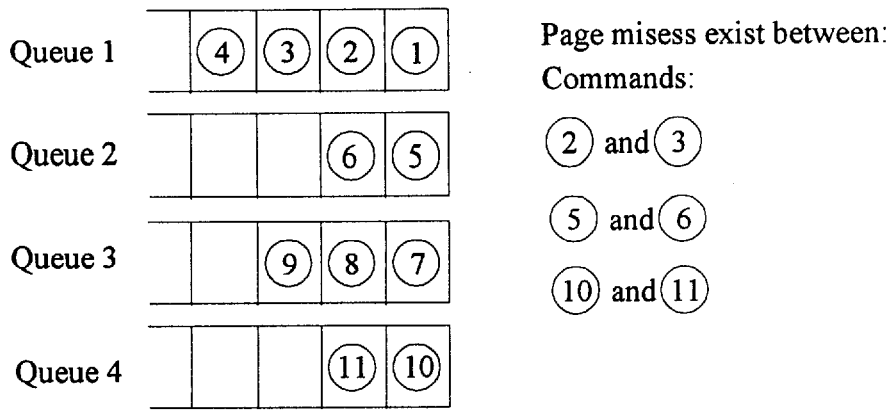

Page misess exist between:
Commands:

④ and ③

⑤ and ⑥

⑩ and ⑪

| Steps | Actions | | Commands Completed |
|---|---|---|---|
| 1 (Start from Q1) | Command ① RAS1 | | |
| 2 | Command ① CAS1 | Command ⑤ RAS2 | ① |
| 3 | Command ② CAS1 | Command ⑦ RAS3 | ② |
| 4 (Switch to Q2) | Command ⑤ CAS2 | Command ⑩ RAS4 | ⑤ |
| 5 (Switch to Q3) | Command ⑦ CAS3 | Command ③ RAS1 | ⑦ |
| 6 | Command ⑧ CAS3 | Command ⑥ RAS2 | ⑧ |
| 7 | Command ⑨ CAS3 | | ⑨ |
| 8 (Switch to Q4) | Command ⑩ CAS4 | | ⑩ |
| 9 (Switch to Q1) | Command ③ CAS1 | Command ⑪ RAS4 | ③ |
| 10 | Command ④ CAS1 | | ④ |
| 11 (Switch to Q2) | Command ⑥ CAS2 | | ⑥ |
| 12 (Switch to Q4) | Command ⑪ CAS4 | | ⑪ |

Fig. 6

MEMORY CONTROLLER AND METHOD OF MEMORY ACCESS SEQUENCE RECORDERING THAT ELIMINATES PAGE MISS AND ROW MISS PENALTIES

FIELD OF THE INVENTION

The present invention relates to an improved method and system to effectuate memory access sequence reordering in a memory controller. More specifically, the present invention relates to a computer memory controller which utilizes a novel memory access sequence reordering system so as to minimize average memory access latency by eliminating penalties associated with row miss and/or page miss, and maximize overall memory utilization efficiency.

BACKGROUND OF THE INVENTION

The speed of processors has been steadily increasing, and, as a result, the need for a more efficient memory controller to provide faster overall memory access is now becoming an important subject. In the computer systems design, memory latency, which is the delay incurred when retrieving data from main memory, is a limiting factor in improving performance.

A memory controller is employed to exchange data between the system bus and the main memory (typically DRAMs). A memory controller usually includes a memory command queue which buffers the incoming memory commands issued by processor(s) or I/O devices. Read and write data buffers are also provided in the memory controller as temporary storage for the data read from or written to the DRAM. Recent DRAMs are provided with the fast page mode which allow repeated access to the same row for faster access to a memory location, provided that it is accessing the same row address as the previous memory access command. With the page mode DRAMs, each DRAM access command includes the memory address (where the data is stored), a Row Address Strobe (RAS) and a Column Address Strobe (CAS). The RAS and CAS control the timing of DRAM to latch the row and column addresses.

FIG. 1 illustrates the architecture of a current shared-bus, shared-memory multiple-processor system. Multiple processors are connected to the system bus. Modern processors such as Pentium-Pro and PowerPC 620 have included second level caches and cache coherence capability. Hence no gluing logic is needed between processors and the system bus. An I/O bridge is normally used to transfer data between the system bus and the I/O bus where multiple I/O devices can be attached. A memory controller is employed, as shown in FIG. 1, to exchange data between the system bus and the main memory, typically DRAM. The memory controller typically includes a memory command queue, which buffers the incoming memory commands issued by the processor(s) or I/O devices. A read and a write data buffer are also shown in FIG. 1 as a temporary storage for the data read from or written to the DRAM. Each DRAM access command includes the memory address where the data is stored or to be stored, a Row Address Strobe (RAS), and a Column Address Strobe (CAS), which control the timing of DRAM to latch the row and colunmn addresses. Though not present in the figure, other command signals such as Write Enable (WE) are also required.

Most advanced system buses have adopted split-transaction mechanisms. In a split-transaction bus, each transaction on a system bus is split into multiple phases (e.g., arbitration phase, request phase, error phase, snoop phase, response phase, and data phase). Pipelining or overlapping the phases of different transactions can improve bus performance. Some split-transaction buses, such as PowerPC 620 Bus, allow for out-of-order completion of the transactions. For example, transactions A, B, C that have been issued to the bus in a sequential order may be completed in the order of C, A, B. In this arrangement, each transaction is attached with a tag, and the transactions on the bus are recognized by their tags but not by their orders. Out-of-order completion mechanism further improves bus performance and design flexibility of the core logic such as the memory controller and I/O bridge.

FIG. 2 is a schematic drawing showing a typical organization of the main memory that has been commonly employed in the art. In FIG. 2, each block in conjunction with an RA (row address) and a CA (column address) side bars collectively represent a DRAM cell. Typically, multiple cells are grouped into banks, or commonly referred to as "rows" (e.g., ROW1, ROW2, etc.), and the data output from a row is typically called a word. These rows of memory cells may also be called as memory banks. FIG. 2 shows a main memory with four rows, or four memory banks, each of which consists of four DRAM cells. Typically, data in and from each memory cell is eight-bit, and the data in or from the four memory banks are either concatenated into or cascaded from a 32-bit word. All the memory cells in the same row (i.e., same bank) share the same "row" and "column" addresses. However, other arrangements are possible. Accessing a data in the main memory includes the following steps: First, a row address enters the RA which is latched by an RAS (Row Address Strobe) signal. (It should be noted that the word "row" used in a "row of a DRAM cell" should not be confused with the "row" used in a "row in the main memory". In the former, the word "row" means a sub-part, or a page, of the memory cell. On contrast, in the latter, the word "row" means an aggregation, or a bank, of a plurality of memory cells.) As mentioned earlier, each DRAM cell contains multiple rows and columns. The "row address" indicates the row address in a DRAM cell. The row location of a data in a DRAM cell is selected by the row address (shown as the shaded rows.) Then, a column address enters the CA which is latched by a CAS (Column Address Strobe) signal. The column location of a data in the DRAM cell is also selected by the column address (shown as the shaded columns). Finally, the data flows out of (during a read command) or into (during a write command) the memory location at which the row and column addresses have been selected. The selected location is indicated as circles in FIG. 2.

Once a data access command (or first data access) is completed, the subsequent data access command (or second data access) may fall into three possible scenarios: page hit (same row address in a memory cell), page miss (same memory row but different row address), and row miss (different memory row). More specifically, if the second data has the same row address as the first data, i.e., it falls into the same row of the main memory (e.g., at the location indicated by triangles), the second data access need not reissue a row address nor the RAS1 signal (the suffix 1 means the first row of memory cells). This condition is called a page hit. A page miss means that the second data falls into the same row (i.e., bank) of the main memory as the first data, but has a different row address (e.g., at the locations indicated by crosses). In the second scenario, the row address must be reissued, and the RAS1 must go through a relatively lengthy "precharge" period. Finally, if the second data falls into a different row of the main memory (e.g., at the location indicated by asterisks), which is defined as a row miss, the row address much be issued to ROW2, but the RAS2 precharge does not increase the memory access latency.

FIGS. 3a through 3c show the timing diagrams of above three scenarios, respectively. In each case, two consecutive memory read operations are considered. FIG. 3a illustrates a page hit scenario. In FIG. 3a, RA and CA of the first data arrive at the DRAM cells of ROW1 consecutively and are latched by RAS1 and CAS1 signals, respectively. Word1 appears on the data bus in clock cycle 5. Since the second data is a page hit in FIG. 3a, no new row address activity is needed. After one cycle of precharge of CAS1, Word2 appears on the data bus in clock cycle 9, and the two back-to-back data read operations are completed in cycle 11.

FIG. 3b shows a page miss scenario wherein RAS1 requires four cycles (cycles 6 to 9) of precharge time before it latches the RA of the second data. Due to the precharge delay in RAS1, the two read operations are completed in cycle 15. Thus the penalty in page miss is four clock cycles, compared to a total of 11 cycles with page hit for completing two read operations. This represents a penalty factor of more than one third of the required clock cycles.

FIG. 3c shows the timing diagram in a row miss scenario. In FIG. 3c, the RA of the second data must be issued to ROW2 (in cycles 6 to 7), but since RAS2 has already been precharged, it can latch RA in cycle 7, and the two operations are completed in cycle 12. Comparing FIG. 3b, 3c with FIG. 3a, a page miss typically causes a penalty of four cycles, and a row miss causes a penalty of one cycle. Thus, although the page mode memory structure can substantially improve the speed of memory access under the right conditions, penalties resulted from page miss and/or row miss can present a considerable drawback.

In a co-pending patent application filed by the same inventors, Ser. No. 08/570,441, the content thereof is incorporated herein by reference, a non-blocking mechanism for memory read/write sequence in the memory controller is disclosed. That invention allows read operations having higher memory access priority than the write operations so that the idle time for a processor waiting for a read data return can be minimized.

U.S. Pat. No. 5,265,236 discloses a method to execute the row address comparison in parallel with the cache lookup. If the cache lookup determines a memory access is required, a fast page memory access request can be made, without the memory controller incurring the additional delay of checking the row address. However, if a page miss occurs, the memory utilization efficiency will be adversely affected.

U.S. Pat. No. 5,461,718 discloses a read buffering system which employs a bank of FIFOs to hold prefetched sequential read data. When the CPU subsequently makes a read request for data in a FIFO, this data can be returned without making a memory access. The system disclosed in the '718 patent also does not solve the penalties associated with page/row misses.

SUMMARY OF THE INVENTION

The primary object of the present invention is to develop an improved method and system to effectuate memory access sequence reordering in a memory controller so as to improve overall memory utilization efficiency. More specifically, the primary object of the present invention is to develop a computer memory controller which utilizes a novel memory access sequence reordering system to minimize average memory access latency by eliminating penalties associated with row miss and/or page miss, so as to maximize the overall memory utilization efficiency.

In the present invention a plurality of memory command queues are utilized in the memory controller. Each command queue corresponds to a row (or bank) of the main memory. Current designs of memory controllers, as illustrated in FIG. 1, employ a single memory command queue which operates in a FIFO fashion. In the conventional design of memory controllers, once a page miss or row miss occurs, a penalty on the system performance is encountered. In the present invention, which involves a plurality of such memory command queues, when a memory access command arrives at the memory controller, it is first queued in a "Unified Command Queue" and later dispatched to one of the "Multiple Command Queues". Those commands that access the same row (of the main memory) are dispatched to the same command queue. The number of the multiple memory command queues equal the number of the memory rows. By executing consecutive commands in the same command queue as disclosed in the method of the present invention, no row miss will occur. To complete the executions, a "Selection Logic" is employed in the present invention to determine which command queue is currently active (i.e. accessing DRAM); all other queues are put on a standby basis.

In the present invention, while the leading command in the active command queue is accessing DRAM, the leading command in a standby command queue may concurrently issue a row address and precharge the RAS utilizing the so-called stealing cycles, which are the clock cycles stolen from the active command queue. Similar to the convention method, commands in the active command queue are executed in a FIFO fashion. The present invention is structured such that only in one of the two conditions will the active command queue grant the memory access right to a standby queue. One condition is when a page miss occurs, and the other condition is when the current active command queue is empty. One of the advantages of the system disclosed in the present invention is that, since the standby command queue, which is to be made active, has already completed a row address selection and the RAS precharge, no page miss penalty will be experienced during the switchover between the active command queues.

The present invention requires a split-transaction bus with out-of-order completion capability, both of which are well known in the art. In summary, with the improved memory controller disclosed in the present invention, since all commands to the same row of memory cells are grouped into the same command queue, consecutive execution of commands in the same command queue prevent any row miss. Page miss penalty, on the other hand, is avoided by early completion of the RA selection and RAS precharge when a command is still in a standby queue.

BRIEF DESCRIPTION OF THE DRAWING

The present invention will be described in detail with reference to the drawings showing the preferred embodiment of the present invention, wherein:

FIG. 6 illustrates the steps of a scenario of command sequences of the present invention which exemplifies the reordering method employed in the present invention;

DETAILED DESCRIPTION OF THE PREFERRED EMBODIMENT

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

The present invention discloses an improved computer memory controller which utilizes a plurality of command queues, wherein each command queue corresponds to a row (or bank) of the main memory, and a novel memory access sequence reordering system to eliminate penalties associated with row miss and/or page miss, so as to minimize average memory access latency and maximize overall memory utilization efficiency.

Figure 1:
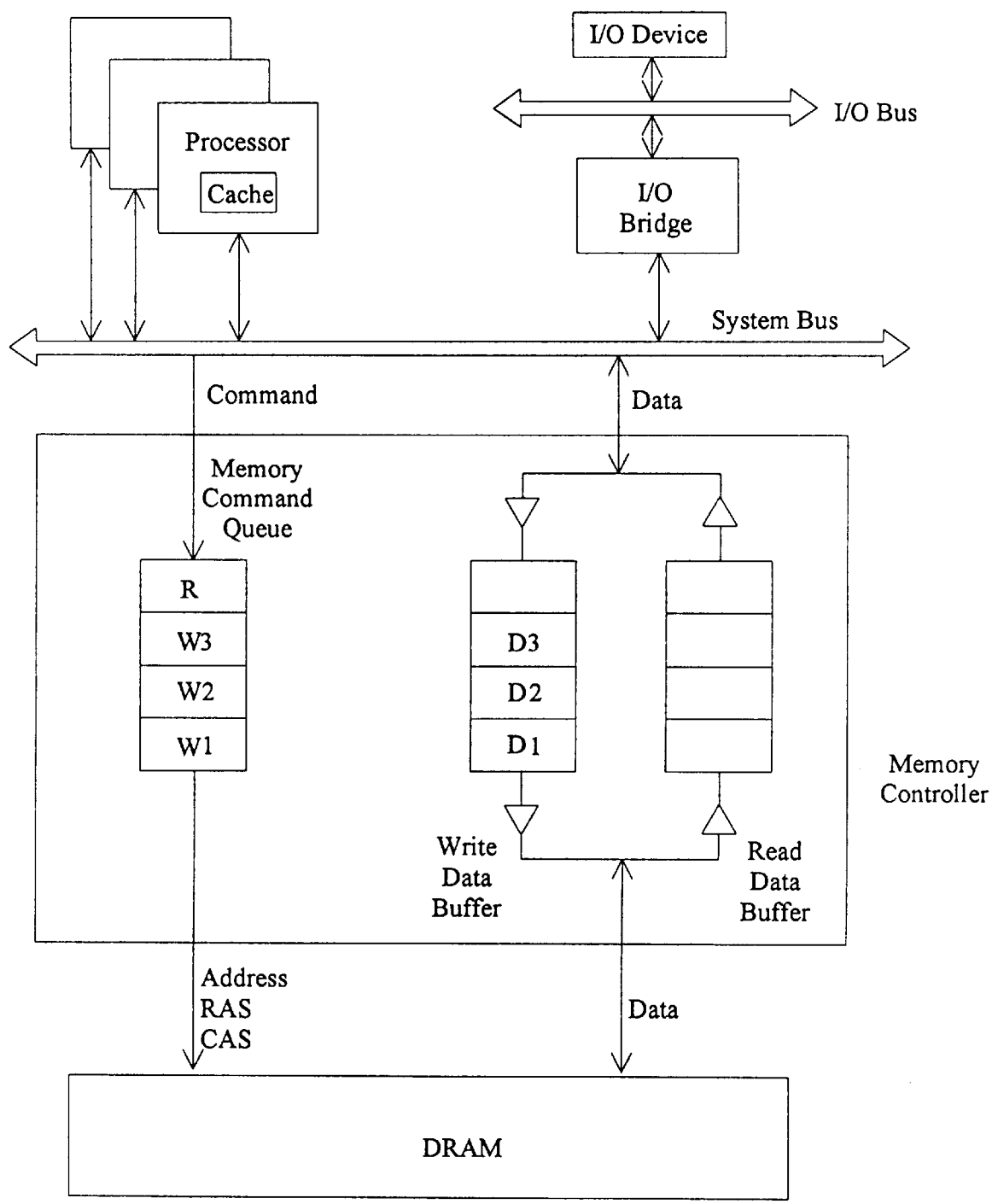
FIG. 1 illustrates a shared-bus, shared-memory multiple-processor system, in which the design of a memory controller is emphasized.
Figure 2:
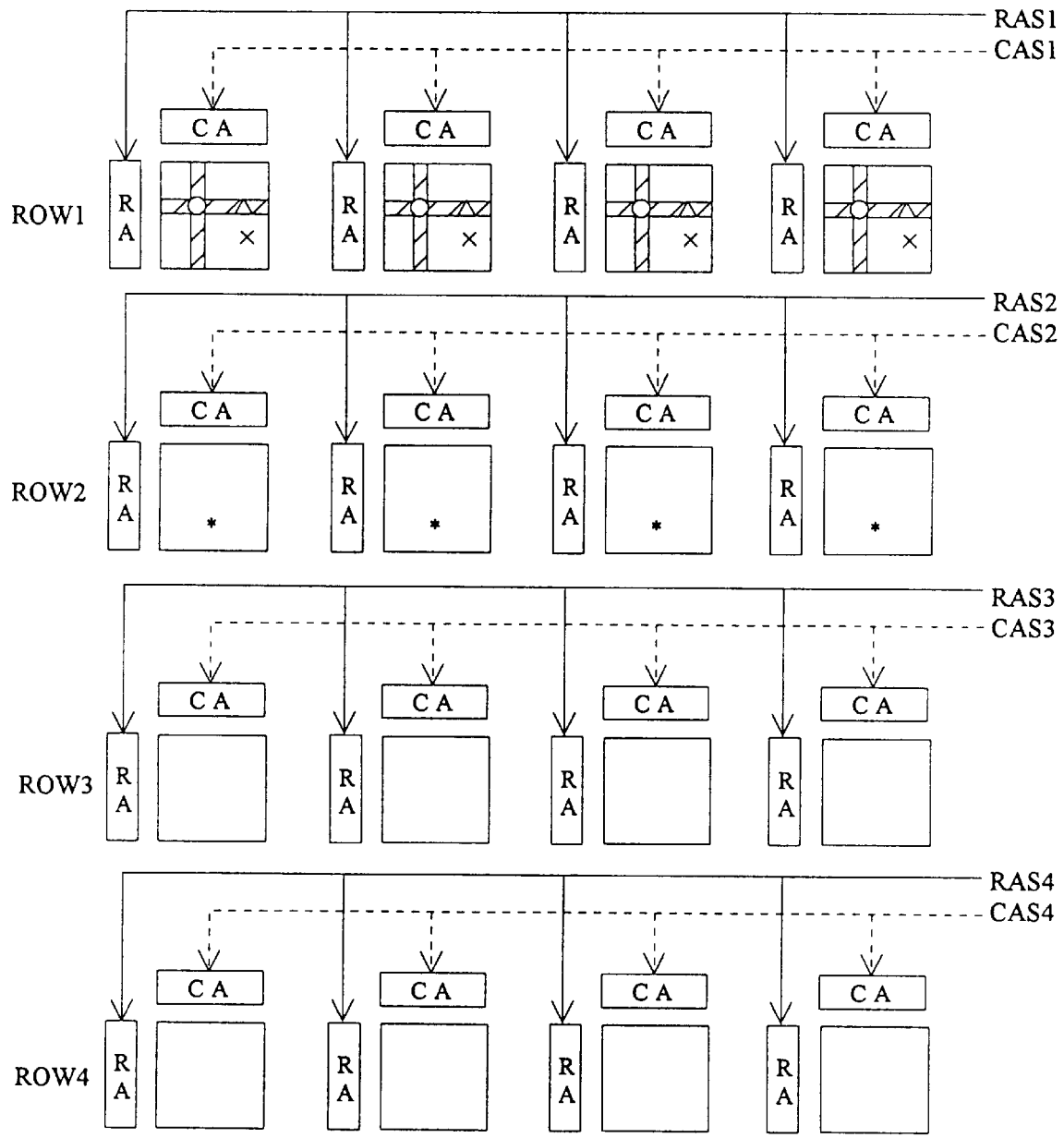
FIG. 2 illustrates the basic organization of a fast-page mode DRAM containing a plurality of rows of memory cells.
Figure 3A:
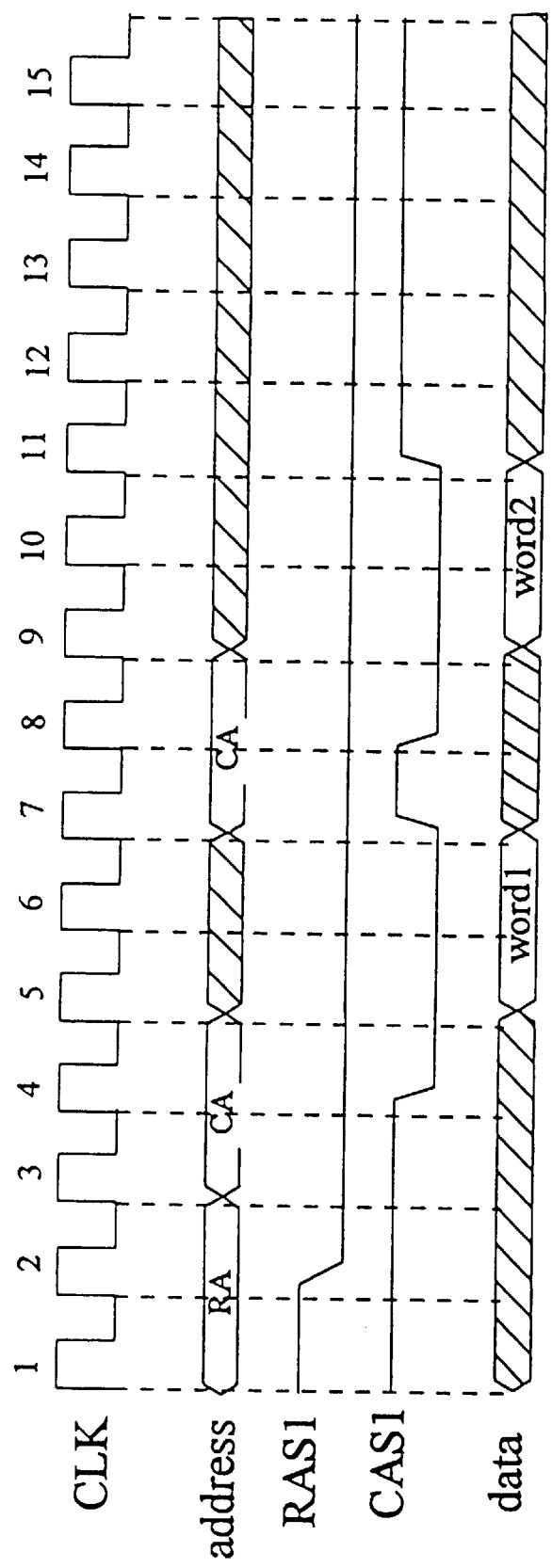
FIG. 3a is a timing diagram of two read operations in which a page hit occurs.
Figure 3B:
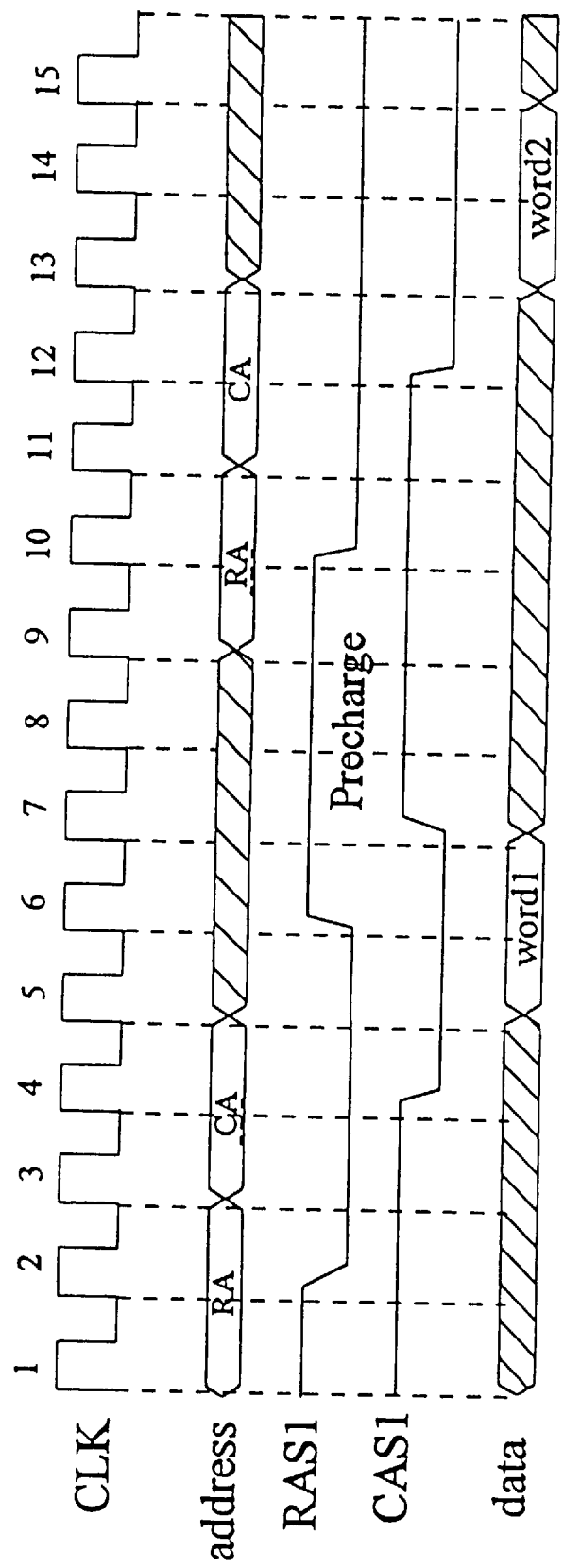
FIG. 3b is a timing diagram of two read operations in which a page miss occurs.
Figure 3C:
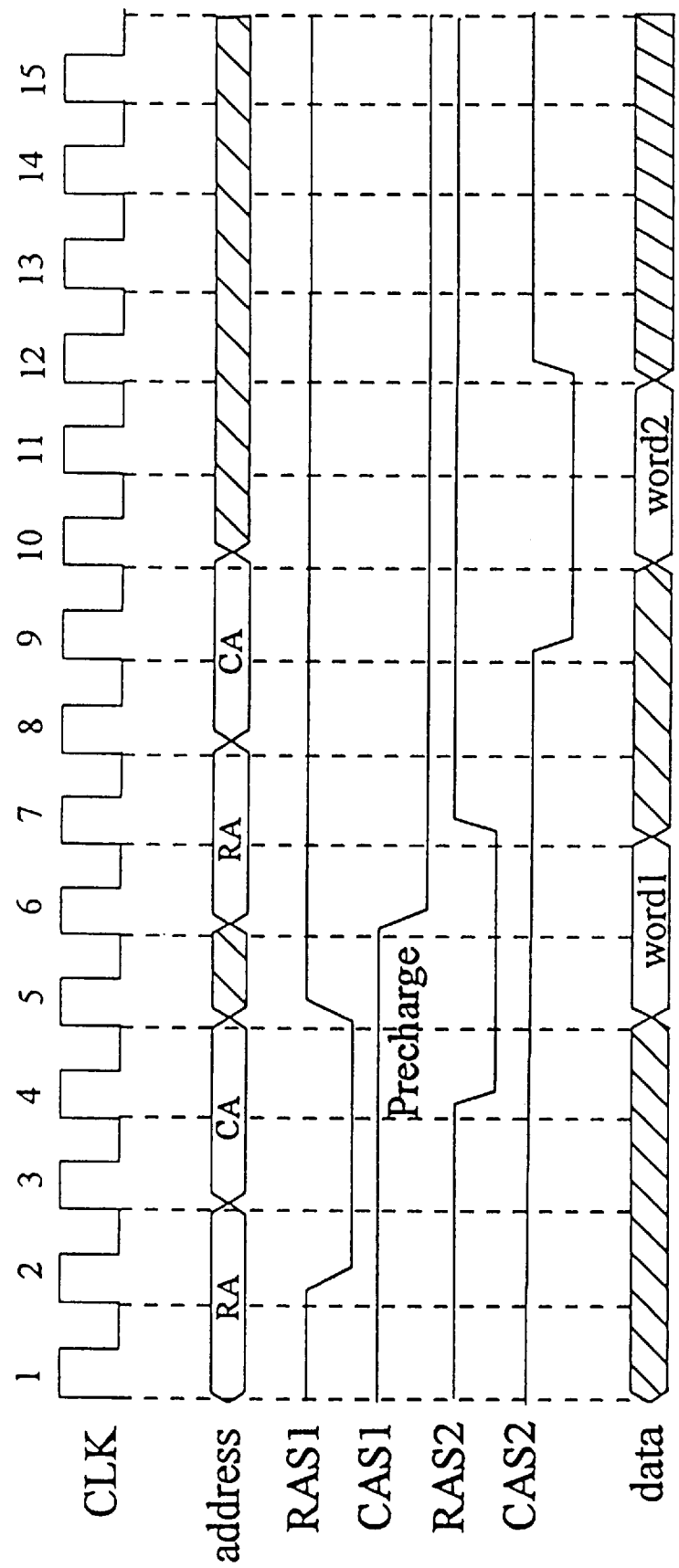
FIG. 3c is a timing diagram of two read operations in which a row miss occurs.

Now refer to the drawings. FIG. 1 illustrates a shared-bus, shared-memory multiple-processor system, in which the design of a memory controller is emphasized. FIG. 2 illustrates the basic organization of a fast-page mode DRAM containing a plurality of rows of memory cells. FIGS. 3a–3c are the timing diagrams of the situations of (a) two read operations in which a page hit occurs; (b) two read operations in which a page miss occurs; and (c) two read operations in which a row miss occurs, respectively. Discussions on these drawings have been provided heretofore in this disclosure.

Figure 4:
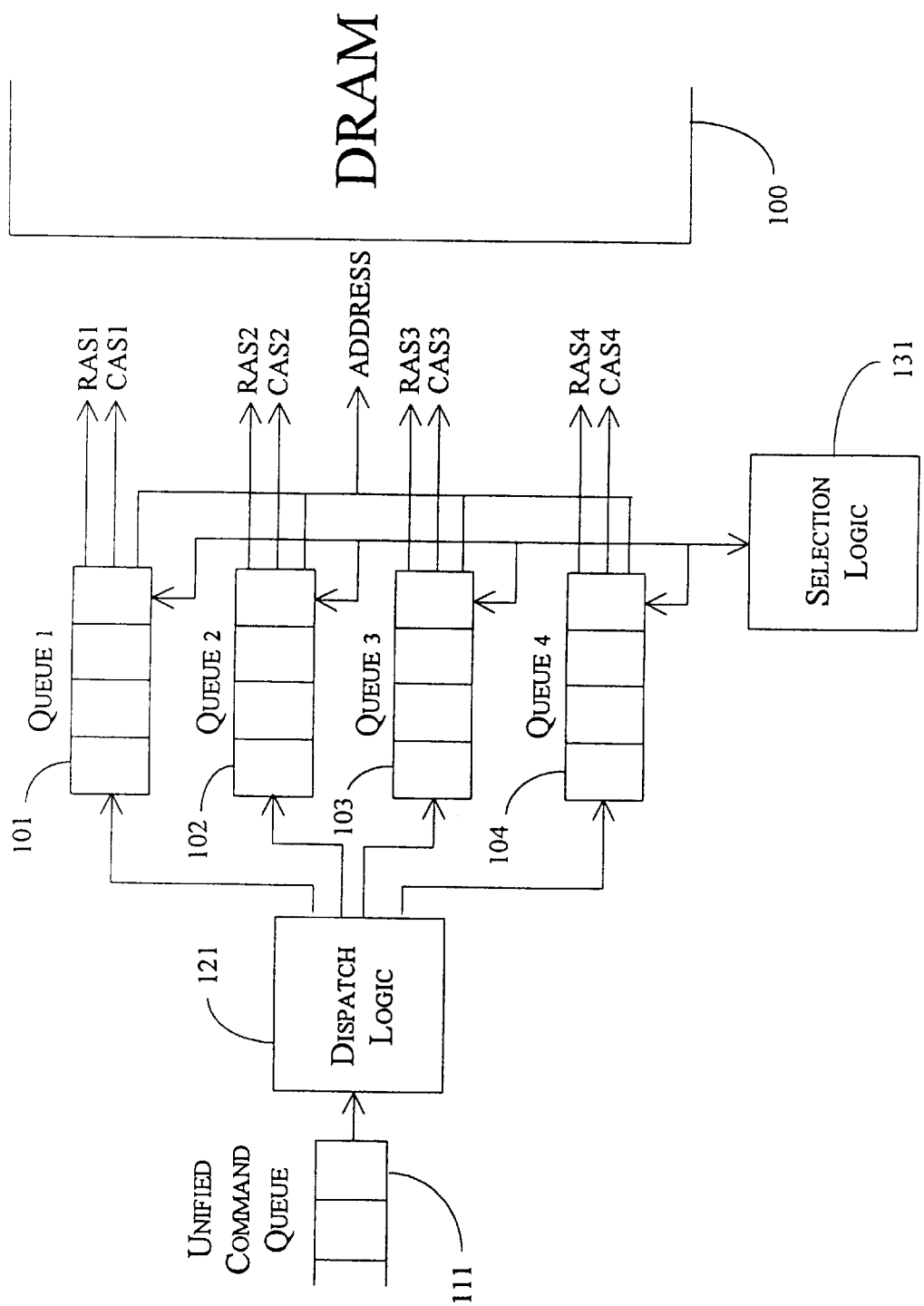
FIG. 4 illustrates a preferred embodiment of the present invention which contains a plurality of memory command queues.

FIG. 4 illustrates a memory controller 10 according to a preferred embodiment of the present invention. It contains four memory command queues, 101 (Queue 1 or Q1), 102 (Queue 2 or Q2), 103 (Queue 3 or Q3), and 104 (Queue 4 or Q4). The number of command queues corresponds to the number of rows (i.e., banks) of memories cells in the DRAM 100. An incoming memory access command, which enters the memory controller 10 via a Unified Command Queue 111, is dispatched to one of the command queues by the Dispatch Logic 121, according to which memory row in the DRAM 100 that this command is accessing. At the other end of the command queues, 101–104, a Selection Logic 131 picks an active queue to access the DRAM. For example, in FIG. 4, Queue1 (101) can be assumed as currently an active queue. The leading command (i.e. the command currently stored in the right-most slot of the command queue, 101) issues a row address to the DRAM accompanied by a RAS1 signal, which latches the row address. Then, a column address is similarly issued and latched by a CAS1 signal.

Figure 5A:
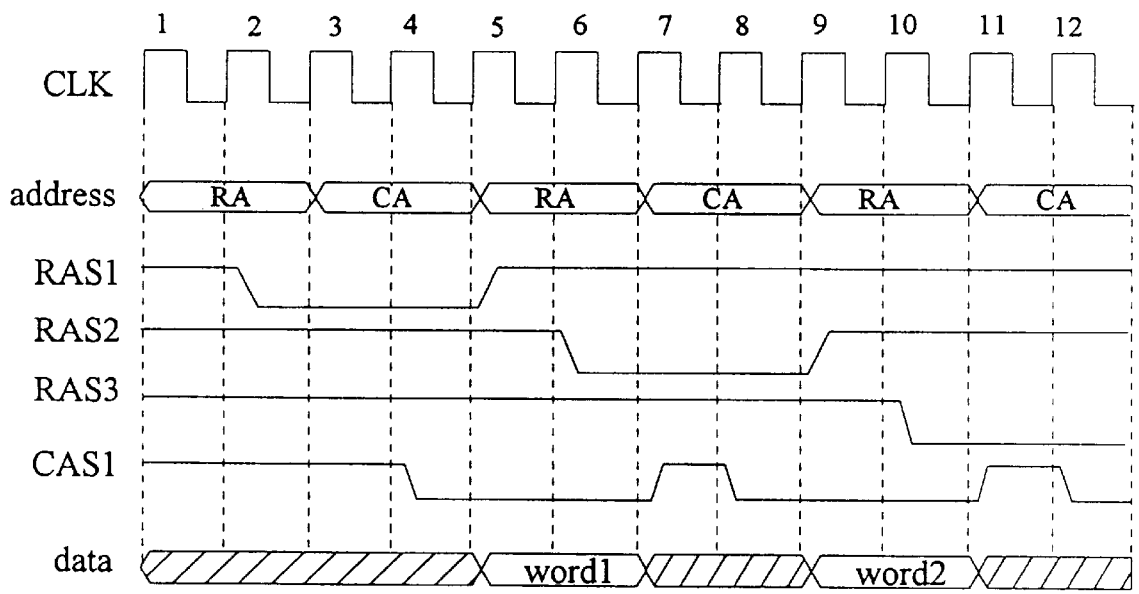
FIG. 5a is a timing diagram of an operation of the present invention involving an early RA selection.

The first four cycles of the timing diagram of the these operations, as shown in FIG. 5a, are identical to the first four cycles of FIG. 3a, which depicts a page hit scenario under the conventional approach. FIG. 3a, however, shows that the address bus is idle in clock cycles 5 and 6, even with the best scenario.

In the present invention, a standby command queue is allowed to perform an early row address selection, to take advantage of the idle clock cycles 5 and 6 as shown in FIG. 3a of the conventional approach. These newly-found clock cycles are called "stolen cycles" in the present invention, because the standby queue is not yet active, but is allowed to steal these cycles from the active queue. A timing diagram with early row address selection is shown in FIG. 5a. In cycles 5 and 6, the leading command of Q2 corresponding to ROW2 of the DRAM issues a row address (RA) and asserts RAS2. Before the second command in Q1 issues the column address (CA) in cycle 7, the leading command in Q2 will have completed its row address selection. By the same token, the row address selection in Q3 can be completed in cycles 9 and 10 before the third command in Q1 issues the column address in cycle 11. In this novel arrangement, the present invention allows standby queues to steal cycles from the operations of the active queue. Comparing the two cases as illustrated in FIG. 3a (prior art, involving a single command queue design) and FIG. 5a (the present invention, involving a plurality of command queues), while Word2 appears on the data bus in cycle 9 in both cases, FIG. 5a also allows Q2 to complete a row address selection in cycles 5 and 6. This extra step of stealing cycles is not allowed in FIG. 3a.

Figure 5B:
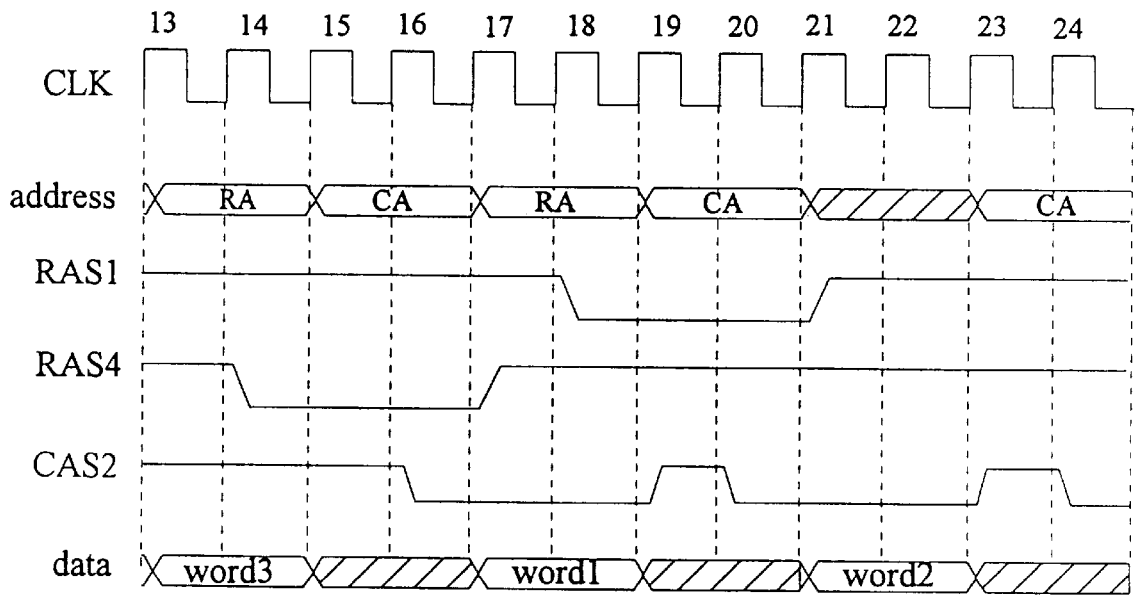
FIG. 5b is a timing diagram of an operation of the present invention involving a switchover between two active queues.

The memory controller disclosed in the present invention is most advantageous during a page miss (i.e., the subsequent address does not fall into the same row as the previous address). FIG. 5b shows a switchover between two active queues of the present invention. In FIG. 5b, it is assumed that, after the third command in Q1 is executed, the fourth command in Q1 manifests a page miss. Under the conventional approach, a penalty of loss of four cycles would inevitably result, associated with this page miss. In the present invention, in comparison, after the leading command of Q4 performs an early row address selection in cycles 13 and 14, Q2, whose leading command has completed a row address selection in cycles 5 and 6, becomes the active queue and a column address is issued in cycles 15 and 16. The returned data of this command (i.e. Word1 of ROW2) appears on the data bus in cycle 17, which is four cycles after Word3 of ROW1, same as the delay during a page hit. In cycles 17 and 18, Q1 steals these two cycles to complete a row address selection, and later, Q2 issues the CA of its second command in cycles 19 and 20. In cycles 21 and 22, the address bus is idle, because all standby queues (i.e. Q3, Q4 and Q1) have now had the row addresses of their leading commands selected. From FIGS. 5a and 5b, it is shown that although a page miss occurs between Word3 and Word4 in Q1, a penalty is prevented in the present invention by making a standby queue active. This point can be further made clear by the observation that a word is constantly put out onto the data bus every four cycles, regardless of whether there is any page miss or any switchover between the active queues.

FIG. 6 provides an example of the steps of the method disclosed in the present invention. In FIG. 6, it is assumed that memory access commands 1 through 11 have been dispatched into Command Queues Q1 through Q4. For simplicity of explanation, it is further assumed that no other commands are issued to any of these command queues until all the eleven commands are executed. In the mean time, FIG. 6 assumes that page misses exist between commands 2 and 3, between commands 5 and 6, and between commands 10 and 11.

In the first step, the Selection Logic 131 picks Q1 as the active queue and command 1 issues row address (RA) and RAS1. The selection of Q1 is arbitrary, and its selection is assumed for illustrative purposes only. As mentioned in FIG. 5a, the RA step typically takes two clock cycles. In the second step, command 1 issues a column address (CA) and CAS1. In the same step (Step 2), command 5 in Q2 steals cycles from Q1 and performs an early row address selection by asserting RAS2. In the third step, command 2 completes CAS1, and command 7 completes RAS3. Now, the leading commands in Q2 and Q3, i.e., commands 5 and 7, respectively, have both completed early row address selections. Since it is assumed that a page miss occurs between commands 2 and 3, the active queue is now caused to be switched to Q2 in the fourth step, in which command 5 completes CAS2 and command 10, the leading command of Q4, completes the RAS4 phase. A page miss, again, occurs between commands 5 and 6. At this time, the active queue is now switched to Q3. Accordingly, in the fifth step, command 7 (i.e. the leading command of Q3) completes CAS3 and command 3 (i.e. the current leading command of Q1) performs RAS1. The process continues until all the commands are executed. Because the present invention utilizes a split-transaction bus with out-of-order completion capability, switching over from the active queue to a standby queue can be easily achieved. The technology for performing such switchover has been taught in the art.

The above embodiment as illustrated in FIG. 6 assumes that the active queue is selected on a cyclic basis. In this embodiment, when a page miss occurs on Q1, the next command queue, i.e., Q2, will be selected as the active queue. Other selection methods may also be used. A first alternative embodiment is to select a standby queue which contains the most number of commands. This embodiment prevents any queues to become full too often. Another alternative embodiment is to select a standby queue whose leading command is a read command. The second alternative embodiment gives read commands a higher priority than write commands to access DRAM so that the utilization of CPUs, which generally has to wait for a read response, can be improved. The first embodiment, which utilizes the cyclic method, is, however, the simplest in its implementation. Other methods, though present some merits, may increase the design effort required in the Selection Logic.

Figure 7A:
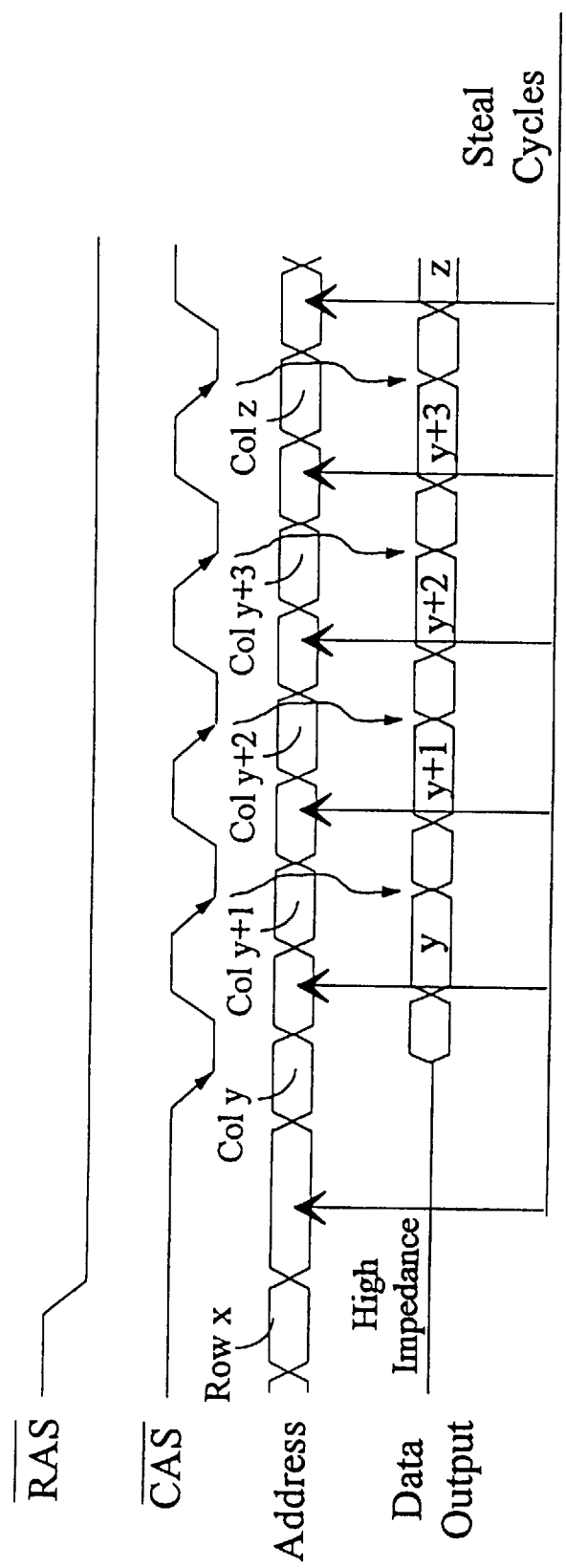
FIG. 7a is a timing diagram of an application of the present invention in an EDO DRAM.
Figure 7B:
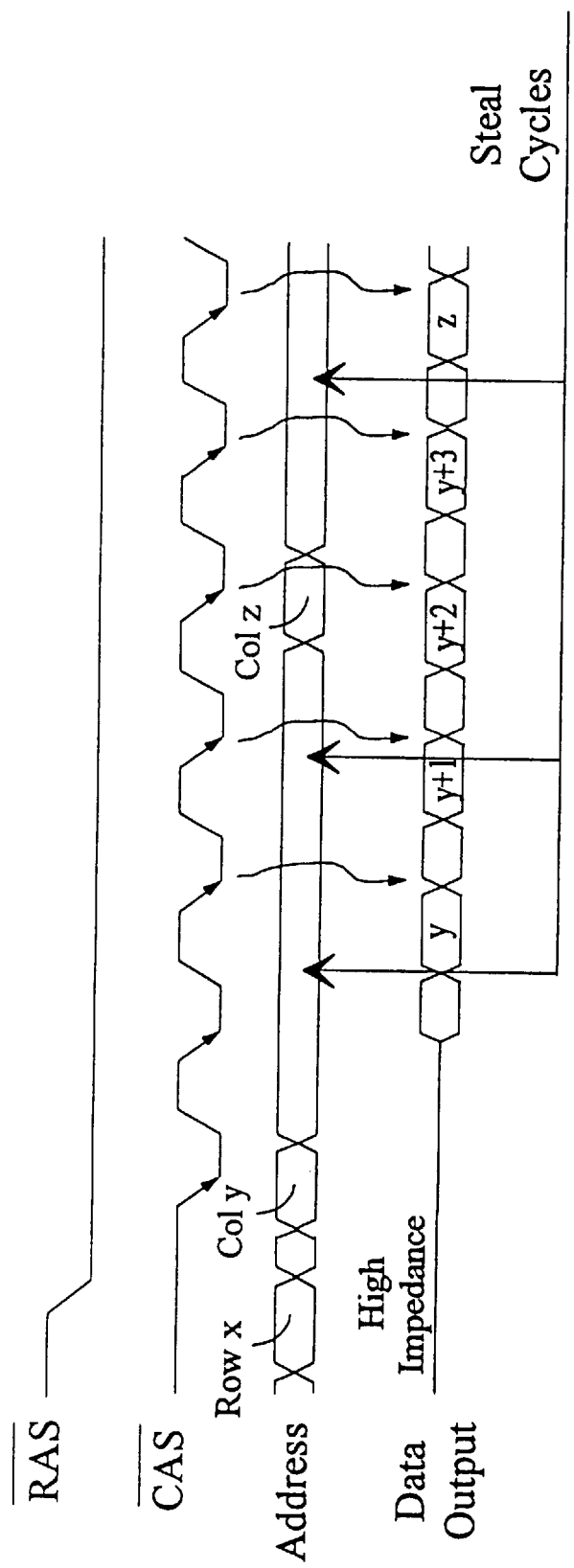
FIG. 7b is a timing diagram of an application of the present invention in a Burst EDO DRAM.
Figure 7C:
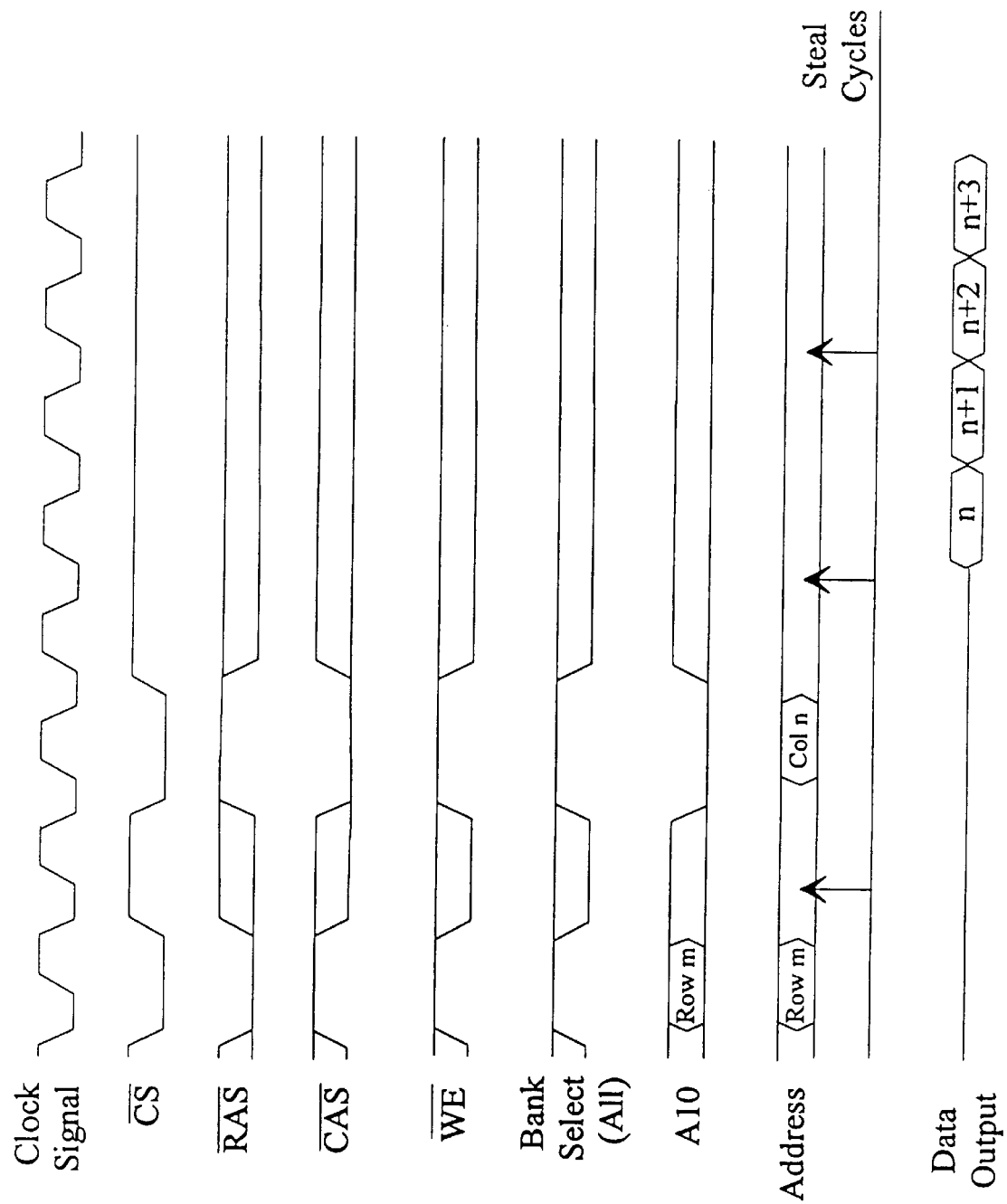
FIG. 7c is a timing diagram of an application of the present invention in a Synchronous DRAM.

The method disclosed in the present invention can also be utilized in other memory structures. FIG. 7a is a timing diagram of an application of the present invention in an EDO (extended data output) DRAM; FIG. 7b is a timing diagram of an application of the present invention in a Burst EDO DRAM; and FIG. 7c is a timing diagram of an application of the present invention in a Synchronous DRAM.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A memory controller for use with a computer memory in response to a memory access command from a CPU, said computer memory containing a plurality of memory banks of page mode memory cells, and said memory controller comprising:
   (a) a unified command queue for receiving said memory access command;
   (b) a plurality of command queues equalling in number to the number of said memory banks;
   (c) a dispatch logic for dispatching said memory access command into one of said command queues in accordance with which memory bank said access command is to access;
   (d) a selection logic for selecting one of said command queues as an active command queue to execute a command, wherein all the non-selected command queues are placed on a standby status as standby command queues; and
   (e) switching means provided in said selection logic for switching said active command queue to a standby command queue, which is selected according to a predetermined criterion, when a page miss is detected or when said active command queue is empty.

2. A memory controller according to claim 1 wherein said switching means also contains a stealing cycle means by which one of said standby command queues is caused to perform a row address selection when said active command queue is accessing said computer memory.

3. A memory controller according to claim 1 wherein said computer memory is connected to said CPU via a split transaction bus with out-of-order completion capability.

4. A memory controller according to claim 1 wherein said memory access command comprises:
   (a) bank number and row and column addresses of a data stored or to be stored in said memory; and
   (b) a row address strobe (RAS) and a column address strobe (CAS) for controlling the timing of a memory cell to latch said row and column address.

5. A memory controller according to claim 1 wherein said computer memory is DRAM.

6. A memory controller according to claim 1 wherein said each memory cell is 8-bit, said computer memory contains four banks of said memory cells, and said memory controller contains four said command queues.

7. A memory controller according to claim 1 wherein said selection logic operates on a cyclic basis.

8. A memory controller according to claim 1 wherein said selection logic operates based on the criterion by which a standby command queue having the most commands is selected.

9. A memory controller according to claim 1 wherein said selection logic operates based on the criterion by which a standby command queue, whose leading command is a read command, is selected.

10. A method for accessing data from a computer memory in response to a memory access command from a CPU, said computer memory containing a plurality of memory banks of page mode memory cells, and method comprising the steps of:
   (a) using a unified command queue to receive said memory access command;
   (b) using a dispatch logic to dispatch said memory access command into one of a plurality of command queues in accordance with which memory bank said access command is to access, said plurality of command queues being equal in number to the number of said memory banks;

(d) using a selection logic to select one of said command queues as an active command queue to execute a command, wherein all the non-selected command queues are placed on a standby status as standby command queues; and (e) using a switching means provided in said selection logic to switch said active command queue to a standby command queue, which is selected according to a predetermined criterion, when a page miss is detected or when said active command queue is empty.

11. A method for accessing data from a computer memory according to claim 10 wherein said switching means also contains a stealing cycle means by which one of said standby command queues is caused to perform a row address selection when said active command queue is accessing said computer memory.

12. A method for accessing data from a computer memory according to claim 10 wherein said computer memory is connected to said CPU via a split transaction bus with out-of-order completion capability.

13. A method for accessing data from a computer memory according to claim 10 wherein said memory access command comprises:

(a) bank number and row and column addresses of a data stored or to be stored in said computer memory; and (b) a row address strobe (RAS) and a column address strobe (CAS) for controlling the timing of a memory cell to latch said row and column address.

14. A method for accessing data from a computer memory according to claim 10 wherein said computer memory is DRAM.

15. A method for accessing data from a computer memory according to claim 10 wherein said each memory cell is 8-bit, said computer memory contains four banks of said memory cells, and said memory controller contains four said command queues.

16. A method for accessible data from a computer memory according to claim 10 wherein said selection logic operates on a cyclic basis.

17. A method for accessing data from a computer memory according to claim 10 wherein said selection logic operates based on the criterion by which a standby command queue having the most commands is selected.

18. A method for accessing data from a computer memory according to claim 10 wherein said selection logic operates based on the criterion by which a standby command queue, whose leading command is a read command, is selected.

* * * * *